United States Patent [19]

Emery et al.

[11] Patent Number: 5,982,531

[45] Date of Patent: Nov. 9, 1999

[54] SEMICONDUCTOR OPTICAL AMPLIFIER

[75] Inventors: Jean-Yves Emery, Palaiseau; Léon Goldstein, Chaville; Pierre Doussiere, St Germain les Arpajons; Jean Barrau, Gardouch, all of France

[73] Assignee: Alcatel Optronics, Paris, France

[21] Appl. No.: 08/945,589

[22] PCT Filed: Mar. 3, 1997

[86] PCT No.: PCT/FR97/00373

§ 371 Date: Oct. 29, 1997

§ 102(e) Date: Oct. 29, 1997

[87] PCT Pub. No.: WO97/33353

PCT Pub. Date: Sep. 12, 1997

[30] Foreign Application Priority Data

Mar. 5, 1996 [FR] France ................... 96 02748

[51] Int. Cl.$^6$ ............... H01S 3/25; H01S 3/19; H01L 29/06
[52] U.S. Cl. ............... 359/344; 257/18; 372/43
[58] Field of Search ............... 359/337, 344, 359/248; 257/13, 18, 21; 372/43

[56] References Cited

U.S. PATENT DOCUMENTS 5,349,596  9/1994  Molva et al. ................... 372/43
5,521,935  5/1996  Irikawa ................... 372/45
5,574,289  11/1996  Aoki et al. ................... 257/18
5,579,155  11/1996  Kitamura ................... 359/344

OTHER PUBLICATIONS

Emery et al, RCOC '96, 22nd Europ. Conf. Optic. Comm., vol. 3, pp.165–166; abstract only herewith, Sept. 19, 1996.

Grand et al, European Optic. Commun. Ad Networks, 10th Annun. EFOC/Lan '92, pp. 78–80; abstract only herewith, Jun. 26, 1992.

*Primary Examiner*—Nelson Moskowitz
*Attorney, Agent, or Firm*—Sughrue, Mion, Zinn, Macpeak & Seas, PLLC

[57] ABSTRACT

The invention concerns a semiconductor optical amplifier. The optical guide structure of this amplifier comprises a rectangular cross-section active stripe (12). Its material is homogeneous and it is subjected to a tensile strain sufficient to render the amplifier insensitive to the polarisation of the light to be amplified.

The invention finds an application in optical telecommunications.

8 Claims, 1 Drawing Sheet

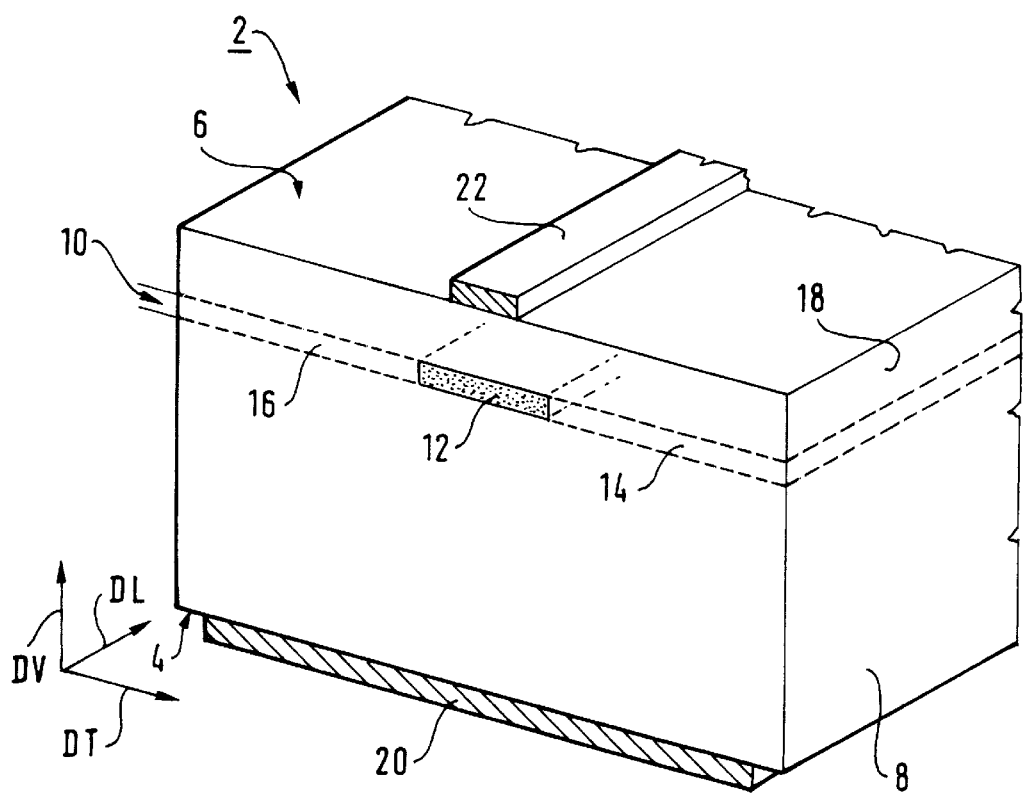

SEMICONDUCTOR OPTICAL AMPLIFIER

BACKGROUND OF THE INVENTION

The present invention concerns the amplification of optical signals. It typically finds applications in fibre optic telecommunication networks. The signals transmitted by these networks consist of pulses carrying information to be transmitted in binary form. These pulses must be amplified to compensate power losses to which they are subject as they propagate in these networks. Semiconductor amplifiers constitute a compact means of providing such amplification that can be integrated. However, in the absence of particular provisions, their gain is sensitive to the polarisation of the light that they receive, which is referred to for simplicity hereinafter as the polarisation sensitivity of an amplifier. This invention find a more particular application in the situation in which this sensitivity must be eliminated or at least limited. This is frequently the case. It arises when the distance travelled by the optical pulses to be amplified is such that the polarisation of the pulses has been affected greatly and at random during their propagation and when it is preferable for the amplified pulses to have one or more predetermined power levels.

More generally, this invention finds applications when an optical amplifier must have no or limited polarisation sensitivity.

A semiconductor optical amplifier includes a wafer comprising layers of semiconductor materials having respective refractive indices and forming a common crystal lattice. In the absence of mechanical strains, the respective lattices of these materials have characteristic dimensions constituting a respective lattice constant of the material. The layers are in succession in a vertical direction forming a right-angle trihedron with two horizontal directions constituting a longitudinal direction and a transverse direction, these directions being defined relative to this wafer. The latter includes at least the following layers or groups or parts of layers:

A substrate consisting mainly of a semiconductor base material having a first type of conductivity. This substrate has a thickness sufficient to impose the lattice constant of the base material on all of the crystal lattice of the wafer.

An active layer including an active material adapted to amplify light by stimulated recombination of charge carriers of both types injected into this material.

A guide structure. This structure include at least one stripe having a refractive index higher than that of the surrounding materials. It extends in the longitudinal direction to guide said light in this direction. This stripe has a transverse width and a vertical thickness.

Finally, a top confinement layer (18) consisting of a material having a second type of conductivity opposite to the first.

This amplifier further includes a bottom electrode and a top electrode respectively formed on the bottom face and the top face of the wafer to enable an electrical current to be passed between these faces to inject said charge carriers of both types into the active material.

The base materials of prior art semiconductor optical amplifiers are of the III–V type. They are typically indium phosphide and gallium arsenide. The active material in typically a ternary or quaternary material comprising the same chemical elements. The width of the stripe that guides the light is generally required to be about one micrometer to facilitate the formation of the stripe by etching and above all to facilitate integration of the amplifier with other optical components on a common semiconductor wafer. The thickness must then be very much less than the width to assure mononodal guidance of the light which typically has a wavelength of 1 310 nm or 1 550 nm. In the absence of specific provisions, it is this rectangular shape of the cross-section of the stripe that gives rise to the polarisation sensitivity previously mentioned.

Various families of prior art amplifiers of this kind are distinguished from each other by the various provisions made therein to render these amplifiers polarisation insensitive.

A first family of prior art amplifiers includes a so-called "ridge" type stripe, i.e. a stripe projecting from the semiconductor wafer. Given that the two lateral faces of a stripe of this kind separate it from a gaseous medium such as air having a refractive index very much lower than that of the semiconductor material, adjusting the height of the stripe imparts to the cross-section of the stripe a shape which, whilst being strongly rectangular, can render the amplifier polarisation insensitive. An amplifier of this first family is described in an article: S. Pajarola, J. Eckner, P. A. Besse, G. Guekos and D. Syvridis, "Temperature behaviour of a bulk InGaAsP/InP ridge waveguide structure for polarisation insensitive optical amplifier operation", Appl. Physics Lett. 65, No.22, pp.2762–2764, 1994.

The amplifiers of the first family have the drawback that it can be difficult to effect the necessary adjustment of the height of the stripe. Note also that the heat generated in the active material in service is difficult to remove because of the low thermal conductivity of the gaseous medium surrounding the stripe, which the active material is necessarily near.

No such adjustment of stripe height is necessary in second and third families of prior art amplifiers known as "buried stripe" amplifiers. In these amplifiers the active material constitutes the stripe guiding the light and is surrounded entirely by a binary semiconductor material. This has the advantage of conducting heat well but its refractive index is only slightly lower than that of the active material.

In said second family of prior art amplifiers the active layer is of the "quantum well" type. This is in contrast to the situation in which the active material is homogeneous, in which case it is known as a bulk material. In the second family the cross-section of the buried stripe is strongly rectangular. Given the small index difference between this stripe and the surrounding binary material, the confinement of a horizontal polarisation wave is better than that of a vertical polarisation wave, the difference between the two confinement factors being in direct proportion to the ratio of the width of the stripe to its thickness. The confinement mentioned here in respect of a wave is considered in a transverse plane. It is equal to the ratio of the power of this wave in the area occupied by the stripe to the total power of the wave. The confinement factor is defined for each polarisation and for each wavelength by the space and the dimensions of the cross-section of the stripe and by the refractive indices of the material of the stripe and of the surrounding material. In the case of a rectangular stripe cross-section it can be regarded as the product of a directional confinement factor in the horizontal direction by a directional confinement factor in the vertical direction, each of these two directional confinement factors being polarisation-dependent. Given that the phenomenon of amplification of the wave by recombination of carriers and stimulated emission is achieved only in the active material, i.e. in the stripe, the gain of the amplifier for a wave is in direct proportion to the confinement factor of the wave. As a result, if the material of the stripe were homogeneous, and moreover isotropic, and therefore polarisation-insensitive, the gain of the amplifier would be greater for horizontal polarisation waves than for vertical polarisation waves.

This is why, in the prior art amplifiers of this second family, the material of the stripe is neither homogeneous nor isotropic. It is firstly a non-homogeneous (i.e. composite) material, because it is in the form of a structure comprising a succession in the vertical direction of layers alternately constituting quantum wells and barriers. The quantum wells are made of the active material and have thicknesses in the order of 8 nm. The barriers are made of the base material and have thicknesses in the order of 10 nm. This quantum well structure is distinguished from other structures that are also made up of successive layers but in which the thickness of the layers are much greater, for example 50 nm. A material that is homogeneous or consists of these thick layers is known a "bulk material".

The material of the stripe is not isotropic because the lattice constant of the active material is smaller than that of the base material. The quantum wells are therefore subjected to a bidirectional tensile strain in the horizontal plane. The effect of this strain is to make the gain gV of the active material for vertical polarisation waves greater than the corresponding gain gH for horizontal polarisation waves, these gains being gains per unit length. The difference between the two gains is in direct proportion to the strain. The effective gain per unit length GH or GV of the amplifier for a horizontal or vertical polarisation wave is the product of the confinement factor CH or CV of that wave by the gain gH or gV of the material of the stripe for that wave, respectively. Choosing a suitable strain for the active material then makes it possible to satisfy the equation:

CH.gH=CV.gV i.e. GH=GV i.e. to render the amplifier polarisation-insensitive.

The amplifiers of this second family have the drawback of a poor spectral position, i.e. the wavelengths of light that can be amplified efficiently by strained quantum well stripes are ill-suited to their transmission over long distances by optical fibres if the strains applied to the wells are sufficient to render the amplifiers polarisation-insensitive. Amplifiers of this second family are described in the articles:

"1.5 μm Multiquantum-Well Semiconductor Optical Amplifier with Tensile and Compressively Strained Wells for Polarisation-independent Gain" M. A. Newkirk, B. I. Miller, U. Koren, M. G. Young, M. Chein, R. M. Jopson, and C. A. Burrus.

IEEE PHOTONICS TECHNOLOGY LETTERS, VOL.4, NO 4, APRIL 1993, and:

"Polarization insensitive multiple quantum well laser amplifiers for the 1300 nm window" L. F. Tiemeijer, P. A. Thijs, T. van Dongen, R. W. M. Slootweg, J. M. M. van der Heijden, J. J. M. Binsma, and M. P. C. Krijn, Appl. Phys. Lett. 62 (8), Feb. 22 1993.

In a manner that is known in itself the application of a tensile strain to an active material favours the gain gV of this material for vertical polarisation waves whether the material is in the form of bulk material or in the form of quantum wells. This is why it is considered that this effect of a strain of this kind might enable a polarisation-insensitive amplifier to be obtained using a bulk active material. A potentially useful structure has been proposed to this end. Before describing this structure it is necessary to specify the problems that occur if a strain of this kind is to be used to this end. One such problem is that the strain can favour de-mixing, i.e. segregation of the components of a quaternary material. However, the most serious problem is related to the inevitable existence of dislocations in the crystal lattice of the semiconductor material. This is because any tensile strain applied to a material of this kind tends to provoke the propagation and the amplification of dislocations of its crystal lattice. These dislocations compromise the energy efficiency of the amplifier, among other things, and can even render it unusable. For each value of the strain and for each material there exists a layer thickness, known as "critical thickness", beyond which incipient dislocations propagate in such a manner that the material becomes unusable. The existence of this critical thickness is described in the article:

"Defects in epitaxial multilayers" J. W. Matthews and A. E. Blakeslee, J. Crystal Growth 27, 118 (1974).

This problem associated with the dislocations has not prevented the production of prior art amplifiers of the second family referred to above because the thicknesses of the quantum wells are substantially less than the critical thickness corresponding to the applied strains. This is why, for cases in which the active material layer thicknesses must exceed those of the quantum wells, and be greater than 30 nm, for example, the potentially useful structure mentioned above would consist in separating such layers by layers of another semiconductor material to a compressive strain that would, on average, compensate the strains which would be applied. However, this potentially useful structure has not in practice appeared to be able to overcome usefully the problem associated with the dislocations. This theoretical structure is described in:

"1.55-μm Polarization-Insensitive Optical Amplifier with Strain-Balanced Superlattice Active Layer" A. Godefroy, A. Le Corre, F. Clerot, S. Salaun, S. Loualiche, J. C. Simon, L. Henry, C. Vaudry, J. C. Keromnes, G. Joulie, and P. Mamouler,

IEE PHOTONICS TECHNOLOGY LETTERS, VOL. 7, NO 5, MAY 1995.

The drawbacks of the prior art amplifiers of the second family and the known problems that would be associated with the use of the above theoretical structure are avoided in a third family of prior art amplifiers in which another structure is used and effectively prevents amplifier polarisation-sensitivity.

The stripe of the amplifiers of this third family is constituted homogeneously of a bulk active material the lattice constant of which is identical to that of the base material so that the material is not strained and is then isotropic. At least approximate polarisation-insensitivity results from the fact that the cross-section of this stripe is square or substantially square, i.e. its width, for example 500 nm, is equal to or slightly greater than its thickness, for example 400 nm. The drawbacks already mentioned relating to an insufficient width of the stripe are then encountered, i.e. in particular the problem of integrating the amplifier with other optical components on a common semiconductor wafer. The third family is described in an article:

"1.55 μm Polarisation Independent Semiconductor Optical Amplifier with 25 dB Fiber to Fiber Gain" F. Doussière, F. Garabedian, C. Graver, D. Bonnevie, T. Fillion, E. Derouin, M. Monnot, J. G. Provost, D. Leclerc, Associate, IEEE, and M. Klenk.

IEEE PHOTONICS TECHNOLOGY LETTERS, VOL. 6 NO 2, FEBRUARY 1994.

These three prior art amplifier families are mentioned in an overview in:

"High Performance MQW Laser Amplifiers for Transmission Systems Operating in the 1310 nm Window at Bitrates of 10 Gbit/s and Beyond", L. F. Tiemeijer, Proc. 21st Eur. Conf. on Opt. Com. (ECOC'95-Brussels) P.259 et seq.

SUMMARY OF THE INVENTION

The present invention aims to avoid the drawbacks mentioned hereinabove. The aim of the present invention is to provide a semiconductor optical amplifier having the following qualities to the greatest possible degree:

ease of fabrication and integration, insensitivity to polarisation, good spectral position, good energy efficiency, and/or high output power.

To this end, it consists in a homogeneous active material semiconductor optical amplifier, a guide structure of the amplifier procuring, for light to be amplified, horizontal confinement in the transverse direction greater than a vertical confinement in the direction of succession of the semiconductor layers. This amplifier is characterised in that its active material is subjected to a tensile strain sufficient to render the gain of this amplifier insensitive to the polarisation of the light to be amplified. This strain is the conventional result of a lattice mismatch between the active material and the base material. Said horizontal confinement is typically equal to the product of said vertical confinement by a confinement asymmetry coefficient greater that 1.02 and more particularly greater than 1.05. The guide structure can be a buried or a ridge type stripe. The width of this stripe is typically between twice and twenty times its thickness.

This invention results in particular from the fact that it has been found that, even in the presence of a high confinement asymmetry coefficient resulting, for example, from the fact that the guide structure is a stripe of strongly rectangular cross-section, the tensile strain to be applied to a homogeneous active material forming the stripe to achieve insensitivity to polarisation was sufficiently low for the thickness of the stripe to remain less than the corresponding critical thickness relating to the dislocations.

BRIEF DESCRIPTION OF THE DRAWINGS

How this invention may be put into effect is described hereinafter and after by way of example with reference to the accompanying drawing, the single FIGURE of which is a perspective view of a buried stripe amplifier in accordance with the invention.

DETAILED DESCRIPTION OF THE PREFERRED EMBODIMENTS

The amplifier shown by way of example includes in a manner that is known in itself a wafer 2 made up of layers of type III–V semiconductor materials having respective refractive indices and forming a common crystal lattice. These materials can have respective crystal lattices in the absence of strains. They then have characteristic dimensions constituting a respective lattice constant of the material. These layers are in succession in a vertical direction DV forming a right-angle trihedron with two horizontal directions constituting a longitudinal direction DL and a transverse direction DT. These directions are naturally defined relative to this amplifier. These layers form a succession in a vertically upwards direction from a bottom face 4 to a top face 6 of the wafer. This succession includes at least the following layers or groups or parts of layers:

A substrate 8 consisting mainly of a two-component semiconductor base material having a first type of conductivity, this substrate having sufficient thickness to impose the lattice constant of the base material on said common crystal lattice.

An active layer 10 including said stripe 12 between two lateral bands 14 and 16. The stripe is constituted homogeneously of an active material with at least three components. This material is active in the sense that it is able to amplify light by stimulated recombination of charge carriers of both types injected into the material. The horizontal dimensions of its lattice constant are less than those of the lattice constant of the base material. Relative to the base material it has a relative lattice constant difference which is typically between −0.05% and −0.20% and preferably between −0.12% and −0.18%, so that the substrate applies a tensile strain to this layer. The ribbon has a refractive index higher than that of the surrounding materials and extends in the longitudinal direction to guide light in this direction. It has a transverse width and a vertical thickness. The width is preferably between twice and twenty times the thickness. It is typically greater than 500 nm and advantageously between 800 nm and 2000 nm to facilitate the formation of the stripe by etching a complete layer of the active material. The thickness is typically between about 100 nm and 400 nm to assure mononodal guiding of light.

Finally, this succession includes a top confinement layer 18 consisting of a material having a second type of conductivity opposite the first.

The amplifier further includes a bottom electrode 20 and a top electrode 22 respectively formed on the bottom face and on the top face of the wafer to enable an electric current to be passed between these two faces. It is this current which injects said charge carriers of both types into the stripe from the substrate and from the top confinement layer.

In one particular instance the operating wavelength of the amplifier is 1 550 nm. The base material is indium phosphide InP, the substrate is of the n type, the active material is a quaternary material

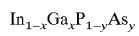

the respective values of the parameters x and y are 0.45 and 0.93 so that the relative lattice constant difference is −0.15%. The top confinement layer consists of p type indium phosphide. The width and the thickness of the stripe are respectively 1000 nm and 400 nm. Many other structures of this amplifier are standard or obvious to the skilled person.

In the case of a ridge type stripe amplifier the relative lattice constant difference of the active material relative to the base material is typically between the two values previously indicated for the case of the buried stripe.

We claim:

1. Homogeneous active material semiconductor optical amplifier, a guide structure of said amplifier procuring, for light to be amplified, a horizontal confinement (CH) in the transverse direction (DT) greater than a vertical confinement (CV) in the direction (DV) of succession of the semiconductor layers, this amplifier being characterised in that said active material (12) is subjected to a tensile strain sufficient to render the gain of this amplifier insensitive to the polarisation of said light to be amplified.

2. Amplifier according to claim 1 characterised in that said horizontal confinement (CH) is equal to the product of said vertical confinement (CV) by a confinement asymmetry coefficient greater than 1.02.

3. Amplifier according to claim 2, said confinement asymmetry coefficient being greater than 1.05.

4. Amplifier according to claim 1, said guide structure having the form of a stripe (12) having a width between twice and twenty times its thickness and greater than 500 nm, this stripe constituting said active material.

5. Amplifier according to claim 1, said active material having at least three components from columns III and V of the periodic table of the elements, said stripe being formed in a semiconductor wafer (2) consisting mainly of a base material having two components respectively belonging to these two columns.

6. Amplifier according to claim 5, said active material having relative to the base material a relative lattice constant difference between −0.05% and −0.20% so that said wafer applies the tensile strain to said stripe.

7. Amplifier according to claim 1 including a wafer (2) constituting of layers of III–V type semiconductor materials having respective refractive indices and forming a common crystal lattice, these materials forming respective crystal lattices in the absence of strains and then having characteristic dimensions constituting a respective lattice constant of the material, these layers being in succession in a vertical direction (DV) forming a right-angle trihedron with two horizontal direction constituting a longitudinal direction (DL) and a transverse direction (DT), these directions being defined relative to this wafer, these layers forming a succession in a vertically upwards direction from a bottom face (4) to a top face (6) of said wafer, said succession constituting at least:

a substrate (8) consisting mainly of a two-component semiconductor base material having a first type of conductivity, this substrate having a thickness sufficient to impose the lattice constant of this base material on the common crystal lattice, an active layer (10) including said stripe (12) between two lateral bands (14 and 16), this stripe consisting of an active material having at least three components adapted to amplify light by stimulated recombination of charge carriers of both types injected into this material, the horizontal dimensions of the lattice constant of this active material being less than those of the lattice constant of the base material, this stripe having a refractive index higher than that of the surrounding materials and extending in said longitudinal direction to guide said light in this direction, this stripe having a transverse width and a vertical thickness, this width being between twice and twenty times this thickness, and a top confinement layer (18) consisting of a material having a second type of conductivity opposite the first, this amplifier further including a bottom electrode (20) and a top electrode (22) respectively formed on said bottom face and on said top face of the wafer to enable an electrical current to be passed between these two faces to inject said charge carriers of both types into the stripe from said substrate and from said top confinement layer.

8. Amplifier according to claim 7, the width of said stripe being between 800 nm and 2000 nm, its thickness being between about 100 nm and 400 nm.

* * * * *